US012757551B2

(12) United States Patent
Jung et al.

(10) Patent No.: US 12,757,551 B2
(45) Date of Patent: Oct. 6, 2026

(54) DISPLAY DEVICE

(71) Applicant: Samsung Display Co., Ltd., Yongin-Si (KR)

(72) Inventors: Haegoo Jung, Yongin-si (KR); Yeon-Shil Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 18/600,770

(22) Filed: Mar. 11, 2024

(65) Prior Publication Data

US 2024/0355984 A1 Oct. 24, 2024

(30) Foreign Application Priority Data

Apr. 21, 2023 (KR) ........................ 10-2023-0052753

(51) Int. Cl.
*H10H 20/857* (2025.01)
*G06F 3/041* (2006.01)

(52) U.S. Cl.
CPC ......... *H10H 20/857* (2025.01); *G06F 3/0412* (2013.01); *G06F 2203/04102* (2013.01)

(58) Field of Classification Search
CPC ................ H10H 20/857; G06F 3/0412; G06F 2203/04102; G06F 3/044; H10K 59/131; H10K 59/12; H10K 59/124; H10K 59/40; H10K 59/87; H10K 77/111; G09F 9/301; G02F 1/133305
See application file for complete search history.

(56) References Cited

U.S. PATENT DOCUMENTS

| | | | | |
|---|---|---|---|---|
| 10,192,896 | B2 | 1/2019 | Kim et al. | |
| 10,211,277 | B2 | 2/2019 | Lee et al. | |
| 10,475,874 | B2 | 11/2019 | Rhe et al. | |
| 10,636,846 | B2 * | 4/2020 | Park | H10K 59/88 |
| 10,672,802 | B2 | 6/2020 | Lee et al. | |
| 10,804,353 | B2 | 10/2020 | Choi et al. | |
| 2019/0123114 | A1 * | 4/2019 | Park | H10K 59/88 |
| 2019/0164995 | A1 * | 5/2019 | Lee | H10D 86/60 |
| 2020/0411598 | A1 * | 12/2020 | Gwon | G06F 3/0412 |
| 2023/0121948 | A1 | 4/2023 | Lee et al. | |

(Continued)

FOREIGN PATENT DOCUMENTS

| | | |
|---|---|---|
| KR | 10-2017-0121392 A | 11/2017 |
| KR | 10-2018-0056497 A | 5/2018 |
| KR | 10-2018-0059633 A | 6/2018 |

(Continued)

*Primary Examiner* — J. E. Schoenholtz
(74) *Attorney, Agent, or Firm* — Innovation Counsel LLP

(57) ABSTRACT

A display device includes: a substrate including a display area, a pad area spaced apart from the display area in a first direction, and a bending area disposed between the display area and the pad area, a transfer line overlapping the pad area and extending from pad area in a direction opposite to the first direction, a connection line disposed on the transfer line, connected to the transfer line, and overlapping the bending area, an organic insulating layer disposed on the connection line and entirely overlapping the connection line, and an inorganic insulating layer disposed on the organic insulating layer, defining an opening overlapping the organic insulating layer, and overlapping one end of the organic insulating layer.

20 Claims, 9 Drawing Sheets

(56) References Cited

U.S. PATENT DOCUMENTS

| | | | | |
|---|---|---|---|---|
| 2024/0057437 | A1 | 2/2024 | Jung et al. | |
| 2024/0257682 | A1* | 8/2024 | Cho | G09G 3/035 |

FOREIGN PATENT DOCUMENTS

| | | | |
|---|---|---|---|
| KR | 10-2019-0064716 | A | 6/2019 |
| KR | 10-2019-0140123 | A | 12/2019 |
| KR | 10-2022-0075205 | A | 6/2022 |
| KR | 10-2022-0082366 | A | 6/2022 |
| KR | 10-2024-0021369 | A | 2/2024 |

* cited by examiner

DISPLAY DEVICE

CROSS-REFERENCE TO RELATED APPLICATION

This application claims priority to and benefits of Korean Patent Application No. 10-2023-0052753 under 35 U.S.C. § 119, filed on Apr. 21, 2023, in the Korean Intellectual Property Office (KIPO), the entire contents of which are hereby incorporated by reference.

BACKGROUND

1. Technical Field

Embodiments provide generally to a display device. More particularly, embodiments relate to a flexible display device.

2. Description of the Related Art

A display device is a device that displays an image to provide visual information to a user. The display device includes a touch sensing layer that senses a touch. The touch sensing layer may include touch electrodes and a touch insulating layer.

The touch insulating layer may include an inorganic insulating layer and an organic insulating layer. In this case, the inorganic insulating layer may also be disposed in a pad area where pads are disposed. When the inorganic insulating layer is oxidized, hydrogen radical and ammonia gas may be released. When hydrogen radical and ammonia gas reach a lower conductive layer, the lower conductive layer may also be oxidized.

SUMMARY

Embodiments provide a display device having improved reliability.

A display device according to embodiments of the present disclosure includes a substrate including a display area, a pad area spaced apart from the display area, and a bending area disposed between the display area and the pad area, a transfer line disposed in the pad area, a connection line disposed on the transfer line, connected to the transfer line, and crossing the bending area, an organic insulating layer disposed on the connection line and entirely covering the connection line, and an inorganic insulating layer disposed on the organic insulating layer to overlap one end of the organic insulating layer and including an opening exposing the organic insulating layer.

In an embodiment, the opening may entirely expose the organic insulating layer in the bending area.

In an embodiment, the organic insulating layer may cover the connection line and one end of the transfer line.

In an embodiment, the one end of the transfer line overlapping the organic insulating layer may be disposed adjacent to the bending area.

In an embodiment, the inorganic insulating layer may include a first sub-layer and a second sub-layer disposed on the first sub-layer, and each of the first sub-layer and the second sub-layer may include silicon nitride.

In an embodiment, a film density of the second sub-layer may be greater than a film density of the first sub-layer.

In an embodiment, the organic insulating layer may include a first organic insulating layer disposed on the connection line and a second organic insulating layer disposed on the first organic insulating layer and overlapping the first organic insulating layer.

In an embodiment, the first organic insulating layer and the second organic insulating layer may include a same material.

In an embodiment, the display device may further include an additional insulating layer disposed on the inorganic insulating layer and including an organic material.

In an embodiment, a length of the first organic insulating layer may be greater than a length of the second organic insulating layer.

In an embodiment, each of the inorganic insulating layer and the additional insulating layer may cover the one end of the organic insulating layer.

In an embodiment, the inorganic insulating layer may cover the one end of the first organic insulating layer and may be spaced apart from the second organic insulating layer, and the additional insulating layer may cover the one end of the organic insulating layer.

In an embodiment, each of the inorganic insulating layer and the additional insulating layer may cover one end of the first organic insulating layer and may be spaced apart from the second organic insulating layer.

In an embodiment, the display device may further include an active layer disposed on the substrate and overlapping the display area a gate layer disposed on the active layer and partially overlapping the active layer, a first conductive layer disposed on the gate layer and overlapping the display area, and a second conductive layer disposed on the first conductive layer and overlapping the display area.

In an embodiment, the first conductive layer may include a same material as the transfer line and is formed at the same time with the transfer line, and the second conductive layer may include a same material as the connection line and is formed at the same time with the connection line.

A display device according to embodiments of the present disclosure includes a substrate including a display area, a pad area spaced apart from the display area, and a bending area disposed between the display area and the pad area, a first transfer line disposed in the pad area an, a connection line disposed on the first transfer line and crossing the bending area, a transfer electrode disposed between the first transfer line and the connection line, and connecting the first transfer line and the connection line, a second transfer line disposed on the same plane as the transfer electrode, connected to the first transfer line, spaced apart from the transfer electrode and the connection line, and disposed in the pad area, and an inorganic insulating layer disposed on the connection line in the pad area and having an edge non-overlapping with an edge of the second transfer line in a plan view.

In an embodiment, the edge of the inorganic insulating layer may overlap the first transfer line.

In an embodiment, the second transfer line may overlap the inorganic insulating layer and the inorganic insulating layer may be disposed adjacent to the bending area than the second transfer line.

In an embodiment, the display device may further include an active layer disposed on the substrate and overlapping the display area, a gate layer disposed on the active layer and partially overlapping the active layer, a first conductive layer disposed on the gate layer and overlapping the display area, and a second conductive layer disposed on the first conductive layer and overlapping the display area.

In an embodiment, the gate layer may include a same material as the first transfer line and is formed at the same time with the first transfer line, the first conductive layer may include a same material as the transfer electrode and the second transfer line and is formed at the same time with the transfer electrode and the second transfer line, and the second conductive layer may include a same material as the connection line and is formed at the same time with the connection line.

In the display device according to embodiments, since an inorganic insulating layer covers one end of the organic insulating layer, damage to a connection line and a transfer line can be prevented. Specifically, hydrogen radical and ammonia gas may be generated when forming the inorganic insulating layer. In this case, when a distance between one end of the inorganic insulating layer, and the connection line and the transfer line is short, hydrogen radical and ammonia gas may easily reach the connection line and the transfer line. However, in the present disclosure, since an organic insulating layer is additionally disposed between one end of the inorganic insulating layer, and the connection line and the transfer line, hydrogen radical and ammonia gas cannot easily reach the connection line and the transfer line. Accordingly, oxidation of the connection line and transfer line can be prevented, and the amount of outgas generation can also be reduced. Accordingly, defect of the display device can be reduced and reliability of the display device can be improved.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
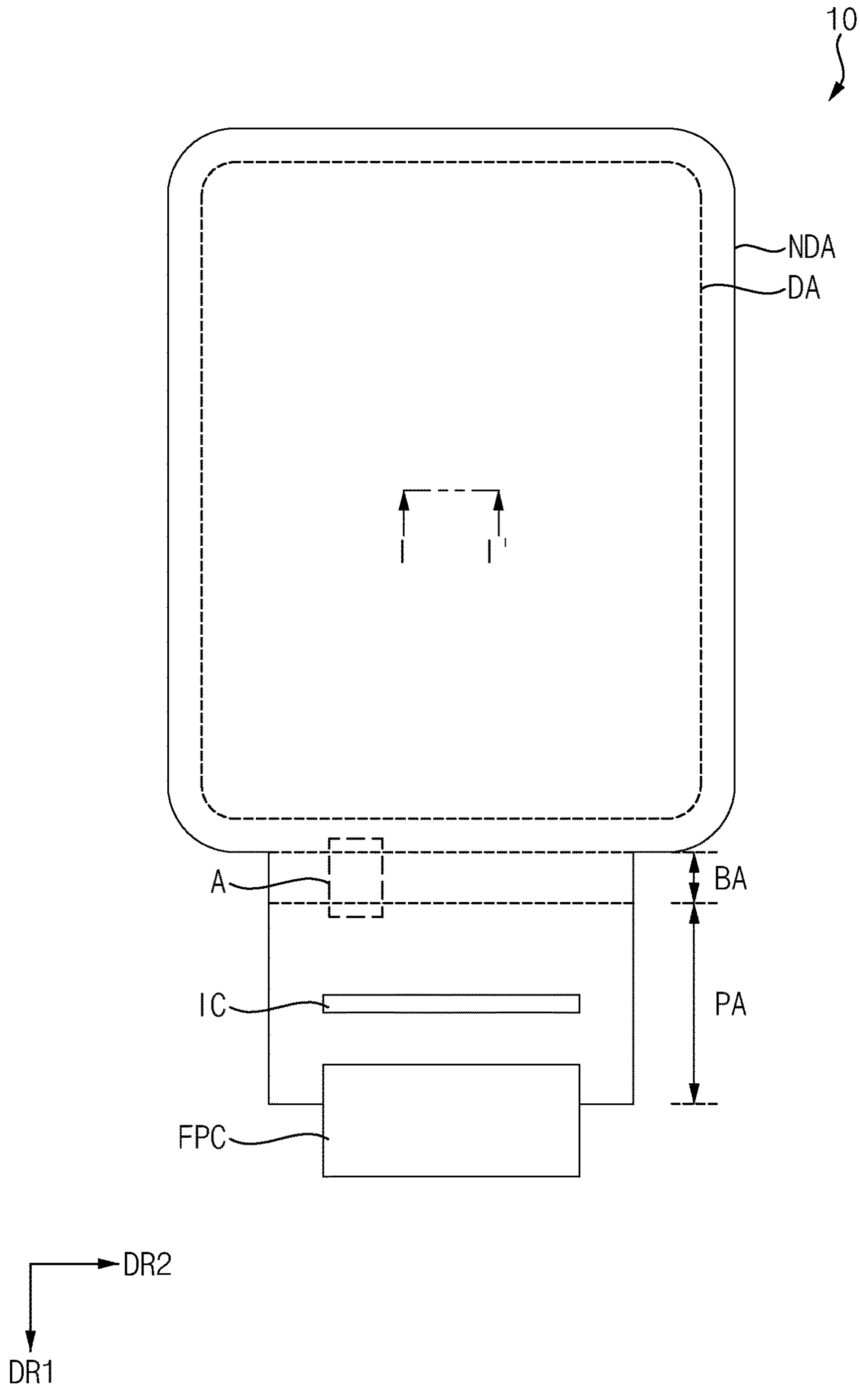
FIG. 1 is a plan view illustrating a display device according to an embodiment of the present disclosure.

Hereinafter, a display device according to embodiments of the present disclosure will be explained in detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, the display device 10 may include a display area DA and a non-display area NDA. The display area DA may be defined as an area that emits light, and the non-display area NDA may be defined as an area where components for transmitting signals to the display area DA are disposed.

A plurality of pixels may be disposed in the display area DA. The plurality of pixels may emit light based on a signal transmitted through the non-display area NDA. The plurality of pixels may be generally disposed in the display area DA. Through this, an image may be displayed by emitting light in an entire area of the display area DA.

A plurality of driver may be disposed in the non-display area NDA. The plurality of drivers may generate and transmit signals for driving the plurality of pixels, such as gate signals, light emitting signals, data signals, a power supply voltage, an initialization voltage, and the like.

The non-display area NDA may include a pad area PA and a bending area BA. The pad area PA may be spaced apart from the display area DA in a first direction DR1. The bending area BA may be disposed between the display area DA and the pad area PA.

In an end product, the bending area BA may be bent, and the pad area PA may be positioned on a rear surface of the display device 10. That is, the pad area PA may not be visually recognized from a front surface of the display device 10. An integrated circuit IC and a circuit board FPC may be disposed in the pad area PA. The integrated circuit IC and the circuit board FPC may be connected to the pad area PA by a conductive film. The integrated circuit IC and the circuit board FPC may generate and transfer signals transmitted to the plurality of pixels.

Although a chip on plastic ("COP") method or a chip on glass ("COG") method is illustrated as a method of disposing the integrated circuit IC in FIG. 1, the integrated circuit IC may be disposed in a chip on film ("COF") method.

Figure 2:
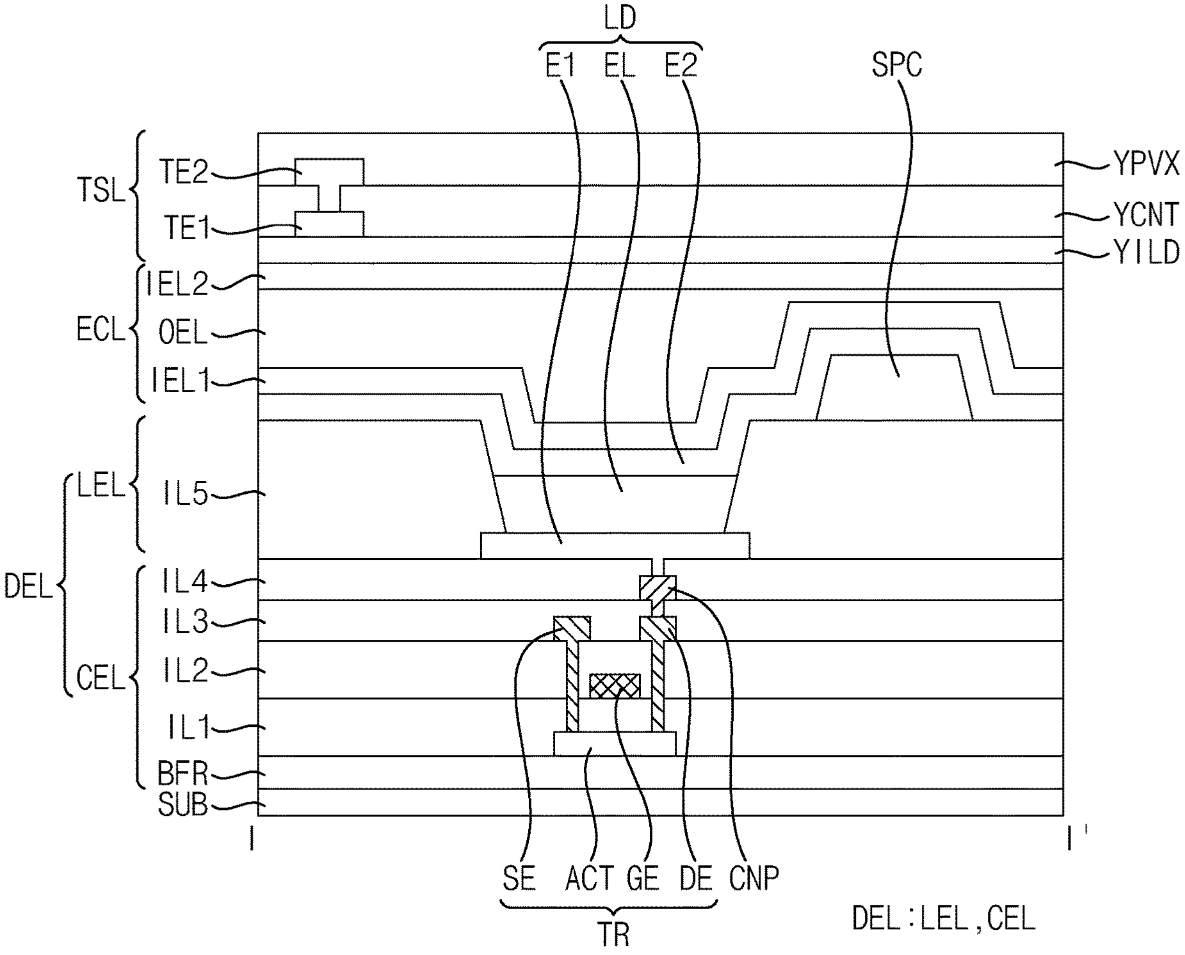
FIG. 2 is a cross-sectional view taken along line I-I' of FIG. 1.

FIG. 2 is a cross-sectional view taken along line I-I' of FIG. 1.

Referring to FIGS. 1 and 2, the display device 10 may include a substrate SUB, a display element layer DEL, and an encapsulation layer ECL. The display element layer DEL may include a circuit element layer CEL and a light emitting element layer LEL.

The circuit element layer CEL may be disposed on the substrate SUB, and may include a buffer layer BFR, at least one transistor TR, a connection electrode CNP, a first insulating layer IL1, a second insulating layer IL2, a third insulating layer IL3, and a fourth insulating layer IL4. The transistor TR may include an active layer ACT, a gate electrode GE, a source electrode SE, and a drain electrode DE. The light emitting element layer LEL may be disposed on the circuit element layer CEL, and may include a fifth insulating layer IL5, a spacer SPC, and a light emitting diode LD. The light emitting diode LD may include a first electrode E1, a light emitting layer EL, and a second electrode E2.

The buffer layer BFR may be disposed on the substrate SUB. The buffer layer BFR may prevent diffusion of metal atoms or impurities from the substrate SUB into the active layer ACT.

The active layer ACT may be disposed on the substrate SUB. The active layer ACT may overlap the display area DA. The active layer ACT may include a source region and a drain region doped with impurities and a channel region disposed between the source region and the drain region.

The first insulating layer IL1 may be disposed on the buffer layer BFR. The first insulating layer IL1 may cover the active layer ACT and may be formed to have substantially the same thickness along the profile of the active layer ACT. However, the present disclosure is not limited thereto, and the first insulating layer IL1 may be disposed on the active layer ACT in a pattern form. For example, the first insulating layer IL1 may include an inorganic material.

A gate layer may be disposed on the first insulating layer IL1. The gate layer may include the gate electrode GE. In an embodiment, the gate layer may partially overlap the active layer ACT. For example, the gate electrode GE may overlap the channel region of the active layer ACT.

The second insulating layer IL2 may be disposed on the first insulating layer IL1. In addition, the second insulating layer IL2 may cover the gate electrode GE and may be disposed with substantially the same thickness along the profile of the gate electrode GE. However, it is not limited thereto.

A first conductive layer may be disposed on the second insulating layer IL2. The first conductive layer may overlap the display area DA. The first conductive layer may include the source electrode SE and the drain electrode DE. The source electrode SE may contact the source region of the active layer ACT through a first contact hole formed in the first and second insulating layers IL1 and IL2. The drain electrode DE may contact the drain region of the active layer ACT through a second contact hole formed in the first and second insulating layers IL1 and IL2. The first conductive layer may include a metal such as aluminum, titanium, and the like.

The third insulating layer IL3 may be disposed on the second insulating layer IL2. In addition, the third insulating layer IL3 may cover the source and drain electrodes SE and DE, and may have a substantially flat upper surface without creating a step around the source and drain electrodes SE and DE. For example, the third insulating layer IL3 may include an organic material.

A second conductive layer may be disposed on the third insulating layer IL3. The second conductive layer may overlap the display area DA. The second conductive layer may include the connection electrode CNP. The connection electrode CNP may contact the source electrode SE or the drain electrode DE through a third contact hole formed in the third insulating layer IL3. The second conductive layer may include a metal such as aluminum, titanium, and the like.

The fourth insulating layer IL4 may be disposed on the third insulating layer IL3. In addition, the fourth insulating layer IL4 may cover the connection electrode CNP and may have a substantially flat upper surface without creating a step around the source and drain electrodes SE and DE. For example, the fourth insulating layer IL4 may include an organic material.

The first electrode E1 of the light emitting layer LEL may be disposed on the fourth insulating layer IL4. The first electrode E1 may have light-reflective or light-transmitting properties. For example, the first electrode E1 may include metal.

The first electrode E1 may contact the connection electrode CNP through a fourth contact hole formed in the fourth insulating layer IL4. Through this, the first electrode E1 may be connected to the transistor TR.

The fifth insulating layer IL5 may be disposed on the fourth insulating layer IL4, and an opening exposing an upper surface of the first electrode E1 may be defined in the fifth insulating layer IL5. The fifth insulating layer IL5 may include an organic material. For example, the fifth insulating layer IL5 may include polyimide. However, the present disclosure is not limited thereto.

The spacer SPC may be disposed on the fifth insulating layer IL5. The spacer SPC may maintain a gap between the encapsulation layer ECL and the substrate SUB. The spacer SPC may include the same material as the fifth insulating layer IL5. The spacer SPC may be formed simultaneously with the fifth insulating layer IL5. Accordingly, the spacer SPC may include an organic material. For example, the spacer SPC may include polyimide. However, the present disclosure is not limited thereto.

The light emitting layer EL may be disposed on the first electrode E1. The light emitting layer EL may be disposed in the opening formed in the fifth insulating layer IL5. In an embodiment, the light emitting layer EL may have a multilayer structure including a hole injection layer, a hole transport layer, an organic light emitting layer, an electron transport layer, and an electron injection layer. The organic light emitting layer may include a light emitting material.

The second electrode E2 may cover the light emitting layer EL and may be disposed on the fifth insulating layer IL5 and the spacer SPC. In an embodiment, the second electrode E2 may have a plate shape covering substantially all of an upper surface of the light emitting layer LEL. In addition, the second electrode E2 may have light-transmitting or light-reflective properties. For example, the second electrode E2 may include metal.

The encapsulation layer ECL may prevent penetration of moisture and oxygen into the light emitting diode LD from the outside. For example, the encapsulation layer ECL may include a first inorganic encapsulation layer IEL1, an organic encapsulation layer OEL, and a second inorganic encapsulation layer IEL2.

The first inorganic encapsulation layer IEL1 may be disposed on the second electrode E2 with substantially the same thickness along the profile of the second electrode E2. The organic encapsulation layer OEL may be disposed on the first inorganic encapsulation layer IEL1, and may have a substantially flat upper surface without creating a step around the first inorganic encapsulation layer IEL1. The second inorganic encapsulation layer IEL2 may be disposed on the organic encapsulation layer OEL.

The touch sensing layer TSL may be disposed on the encapsulation layer ECL. The touch sensing layer TSL may include a first touch electrode TE1, a first touch insulating layer YILD, a second touch insulating layer YCNT, a second touch electrode TE2, and a touch planarization layer YPVX.

The first touch electrode TE1 may be disposed on the first touch insulating layer YILD, and the second touch insulating layer YCNT may be disposed on the first touch insulating layer YILD and the first touch electrode TE1. The second touch electrode TE2 may be disposed on the second touch insulating layer YCNT. The first touch electrode TEL and the second touch electrode TE2 may be spaced apart from each other in a plan view with the light emitting diode LD disposed therebetween.

Each of the first touch insulating layer YILD and the second touch insulating layer YCNT may include silicon nitride. A film density of the second touch insulating layer YCNT may be greater than a film density of the first touch insulating layer YILD.

The touch planarization layer YPVX may cover the second touch electrode TE2 and may be disposed on the second touch insulating layer YCNT. The touch planarization layer YPVX may have a substantially flat upper surface. The touch planarization layer YPVX may include an organic material.

The second touch electrode TE2 may be connected to the first touch electrode TE1 through a contact hole. The touch sensing layer TSL may function as an input unit of the display device 10.

Figure 3:
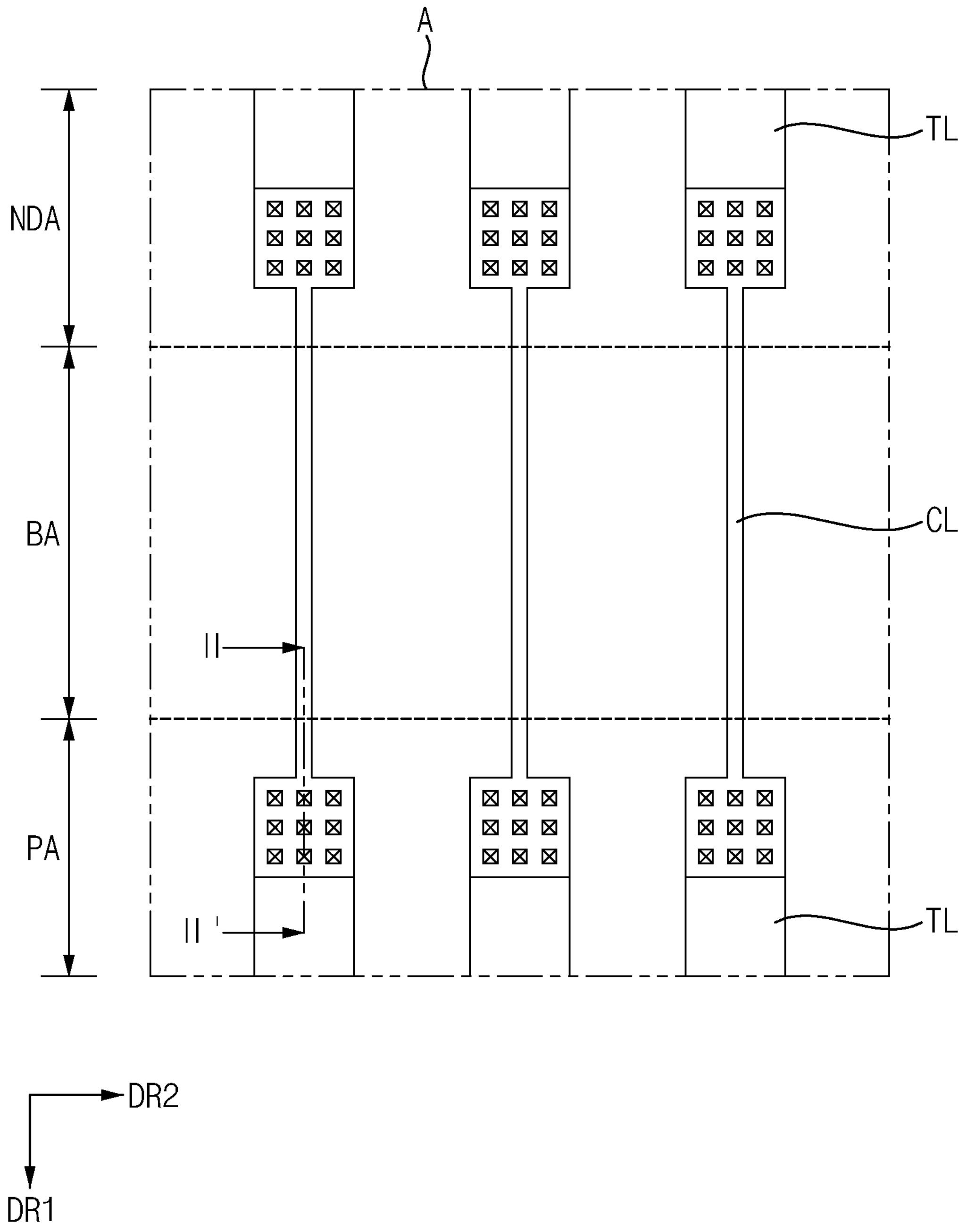
FIG. 3 is an enlarged plan view of area A of FIG. 1.
Figure 4:
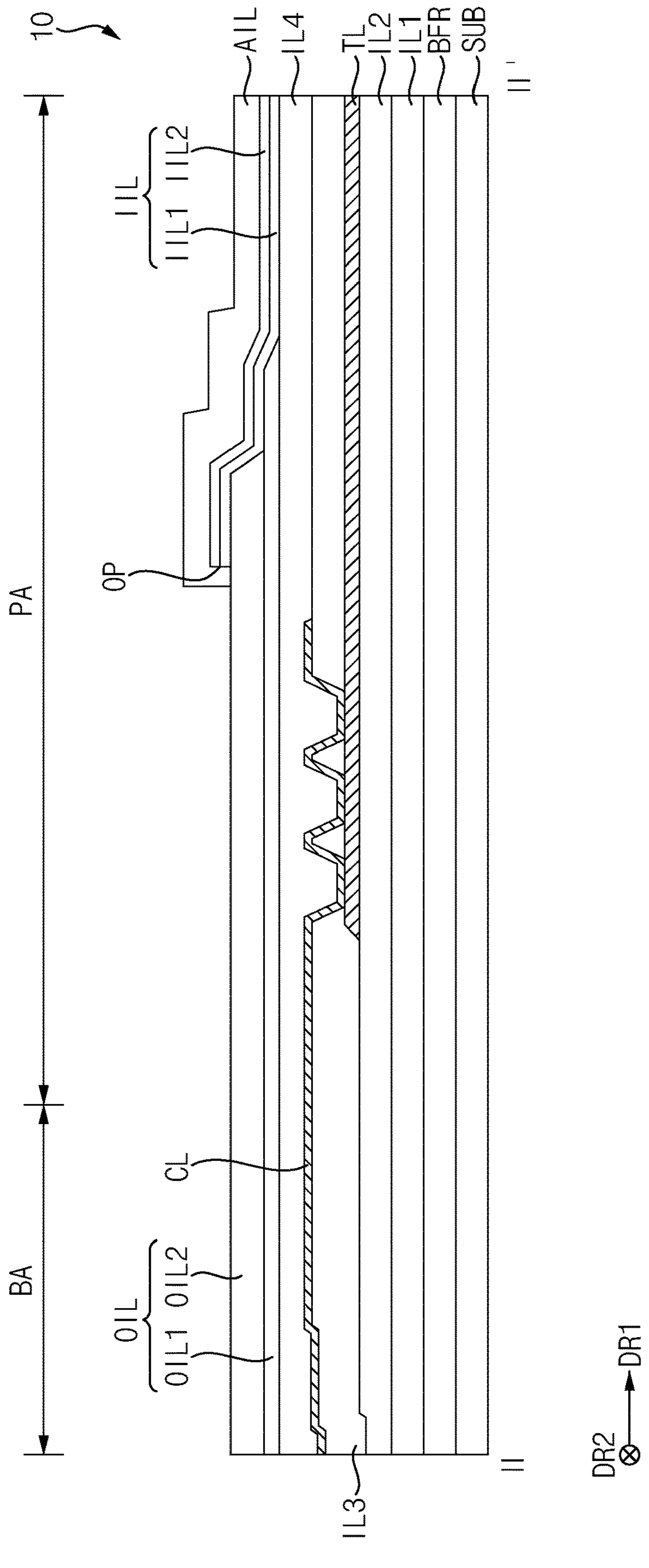
FIG. 4 is a cross-sectional view taken along line II-II' of FIG. 3.

FIG. 3 is an enlarged plan view of area A of FIG. 1. FIG. 4 is a cross-sectional view taken along line II-II' of FIG. 3.

Referring to FIGS. 3 and 4, transfer lines TL and connection lines CL connecting the pad area PA and the non-display area NDA may be disposed in the non-display area DA, the pad area PA, and the bending area BA.

The transfer lines TL may be disposed in the pad area PA or the non-display area NDA. That is, the transfer lines TL overlapping the pad area PA may be connected to the transfer lines TL overlapping the non-display area NDA by the connection lines CL crossing the bending area BA.

In addition, the substrate SUB, the buffer layer BFR, and the first, second, third, and fourth insulating layers IL1, IL2, IL3, and IL4 may extend from the non-display area NDA to the pad area PA.

Hereinafter, the transfer lines TL overlapping the pad area PA will be mainly described. However, the description below may also be applied to the transfer lines TL overlapping the display area DA. For example, the transfer lines TL overlapping the non-display area NDA may have the same configuration as the transfer lines TL overlapping the pad area PA described hereinbelow.

The transfer line TL may be disposed on the second insulating layer IL2 and may overlap the pad area PA. That is, the transfer line TL may be disposed in the same layer as the source electrode SE and the drain electrode DE illustrated in FIG. 2. The transfer line TL may extend from the pad area PA in a direction opposite to the first direction DR1. That is, the transfer line TL may extend in a direction from the pad area PA toward the bending area BA. The third insulating layer IL3 may cover the transfer line TL. However, embodiments of the present disclosure are not limited thereto. For example, the transfer line TL may be disposed in the same layer as the gate electrode GE illustrated in FIG. 2.

The connection line CL may be disposed on the transfer line TL. Specifically, the connection line CL may be disposed on the third insulating layer IL3. In addition, the connection line CL may be disposed in the bending area BA to cross the bending area BA. The connection line CL may be connected to the transfer line TL in the pad area PA. The fourth insulating layer IL4 may cover the connection line CL.

The transfer line TL may include the same material as the first conductive layer that constitutes the source electrode SE and the drain electrode DE. That is, the transfer line TL may be formed simultaneously with the first conductive layer. For example, the transfer line TL may include a metal such as aluminum, titanium, and the like. However, embodiments of the present disclosure are not limited thereto. For example, the transfer line TL may include the same material as the gate layer. That is, the transfer line TL may be formed simultaneously with the gate layer.

The connection line CL may include the same material as the second conductive layer that constitute the connection electrode CNP. That is, the connection line CL may be formed simultaneously with the second conductive layer. For example, the connection line CL may include a metal such as aluminum, titanium, and the like.

An organic insulating layer OIL may be disposed on the connection line CL. Specifically, the organic insulating layer OIL may be disposed on the fourth insulating layer IL4. The organic insulating layer OIL may entirely cover the connection line CL. In addition, the organic insulating layer OIL may cover the connection line CL and one end of the transfer line TL. One end of the transfer line TL overlapping the organic insulating layer OIL may be disposed adjacent to the bending area BA.

The organic insulating layer OIL may include a first organic insulating layer OIL1 and a second organic insulating layer OIL2. The first organic insulating layer OIL1 may be disposed on the fourth insulating layer IL4. The second organic insulating layer OIL2 may be disposed on the first organic insulating layer OIL1 and may be entirely overlapped with the first organic insulating layer OIL1.

The first organic insulating layer OIL1 may include the same material as the fifth insulating layer IL5 disposed in the display area DA. That is, the first organic insulating layer OIL1 may be formed simultaneously with the fifth insulating layer IL5. The second organic insulating layer OIL2 may include the same material as the spacer SPC disposed in the display area DA. That is, the second organic insulating layer OIL2 may be formed simultaneously with the spacer SPC.

In an embodiment, the first organic insulating layer OIL1 and the second organic insulating layer OIL2 may include the same material. That is, the first organic insulating layer OIL1 and the second organic insulating layer OIL2 may be formed simultaneously.

In an embodiment, an inorganic insulating layer IIL may be disposed on the organic insulating layer OIL. The inorganic insulating layer IIL may include an opening OP exposing the organic insulating layer OIL. The opening OP may entirely expose the organic insulating layer OIL disposed in the bending area BA. In addition, the opening OP may extend in the second direction DR2 crossing the first direction DR1.

In an embodiment, a width of the opening OP in the first direction DR1 may be smaller than a width of the organic insulating layer OIL in the first direction DR1. Accordingly, the inorganic insulating layer IIL may overlap one end of the organic insulating layer OIL and cover one end of the organic insulating layer OIL.

The inorganic insulating layer IIL may include a first sub-layer IIL1 and a second sub-layer IIL2. The second sub-layer IIL2 may be disposed on the first sub-layer IIL1. The first sub-layer IIL1 and the second sub-layer IIL2 may include the same material as each other. For example, each of the first sub-layer IIL1 and the second sub-layer IIL2 may include silicon nitride. However, the present disclosure is not limited thereto.

The first sub-layer IIL1 may include the same material as the first touch insulating layer YILD disposed in the display area DA. That is, the first sub-layer IIL1 may be formed simultaneously with the first touch insulating layer YILD. The second sub-layer IIL2 may include the same material as the second touch insulating layer YCNT disposed in the display area DA. That is, the second sub-layer IIL2 may be formed simultaneously with the second touch insulating layer YCNT. A film density of the second sub-layer IIL2 may be greater than a film density of the first sub-layer IIL1.

In an embodiment, the first sub-layer IIL1 may patterned simultaneously with the second sub-layer IIL2. That is, the first sub-layer IIL1 and the second sub-layer IIL2 may be patterned at the same time using the same etching mask.

An additional insulating layer AIL may be disposed on the inorganic insulating layer IIL. The additional insulating layer AIL may entirely overlap the inorganic insulating layer IIL. The additional insulating layer AIL may include an organic material. However, the present disclosure is not limited thereto.

The additional insulating layer AIL may be formed of the same material as the touch planarization layer YPVX disposed in the display area DA. That is, the additional insulating layer AIL may be formed simultaneously with the touch planarization layer YPVX.

In an embodiment, a length of the first organic insulating layer OIL1 in the first direction DR1 may be greater than a length of the second organic insulating layer OIL2 in the first direction DR1. That is, the second organic insulating layer OIL2 may expose one end of the first organic insulating layer OIL1.

In an embodiment, each of the inorganic insulating layer IIL and the additional insulating layer AIL may cover one end of the organic insulating layer OIL. That is, a part overlapping the organic insulating layer OIL in each of the inorganic insulating layer IIL and the additional insulating layer AIL may be disposed on the upper surface of the second organic insulating layer OIL2.

In an embodiment, since the inorganic insulating layer IIL covers one end of the organic insulating layer OIL, damage to the connection line CL and the transfer line TL can be prevented. Specifically, hydrogen radical and ammonia gas may be generated when forming the inorganic insulating layer IIL. In this case, when a distance between one end of the inorganic insulating layer IIL, and the connection line CL and the transfer line TL is short, hydrogen radical and ammonia gas may easily reach the connection line CL and the transfer line TL. However, in the present disclosure, since the organic insulating layer OIL is additionally disposed between one end of the inorganic insulating layer IIL, and the connection line CL and the transfer line TL, hydrogen radical and ammonia gas cannot easily reach the connection line CL and the transfer line TL. Accordingly, oxidation of the connection line CL and transfer line TL can be prevented, and the amount of outgas generation can also be reduced. Accordingly, defect of the display device 10 can be reduced and reliability of the display device 10 can be improved.

Figure 5:
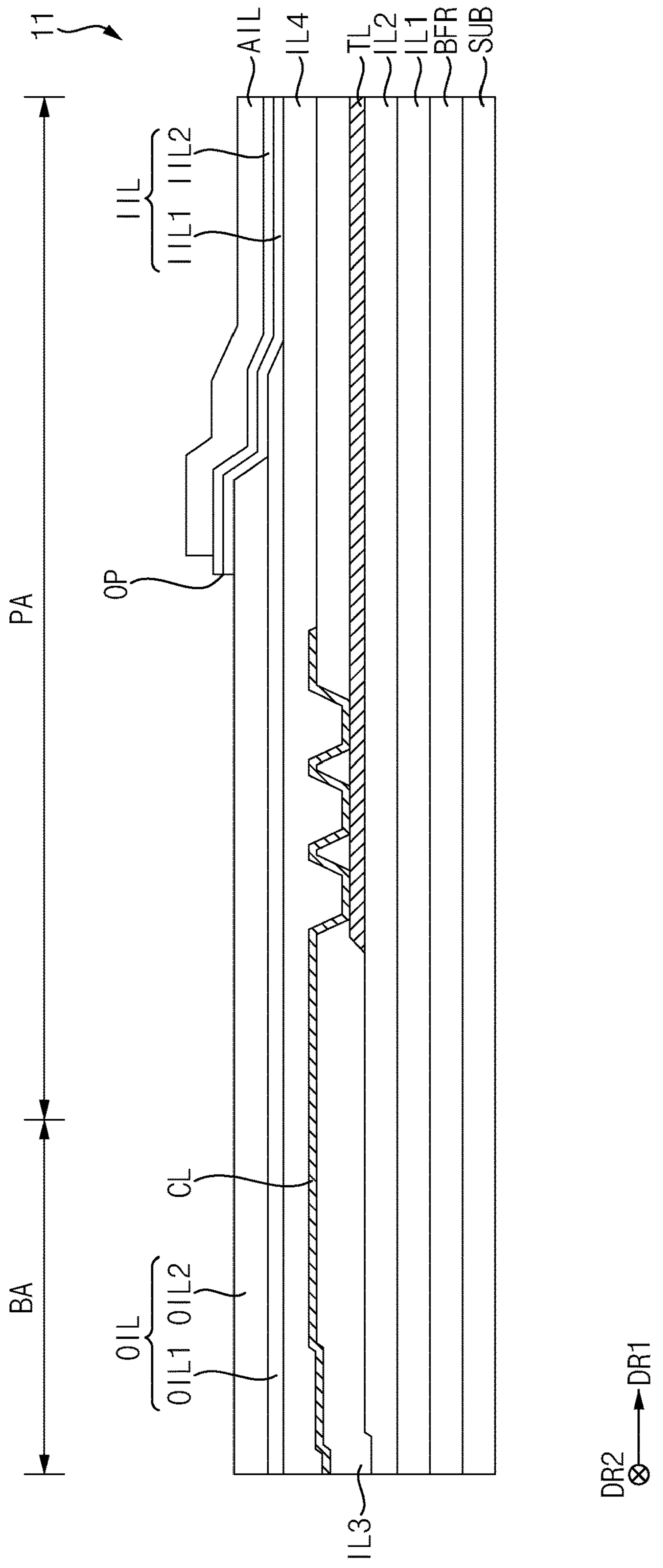
FIG. 5 is a cross-sectional view illustrating another example of FIG. 4.

FIG. 5 is a cross-sectional view illustrating another example of FIG. 4.

For example, the display device 11 described with reference to FIG. 5 may be the same as the display device 10 described with reference to FIG. 4 except for the shape of the additional insulating layer AIL. Accordingly, redundant descriptions may be omitted or simplified.

Referring to FIGS. 3 and 5, the inorganic insulating layer IIL may be disposed on the organic insulating layer OIL. The inorganic insulating layer IIL may include an opening OP exposing the organic insulating layer OIL. The opening OP may entirely expose the organic insulating layer OIL disposed in the bending area BA. In addition, the opening OP may extend in the second direction DR2 crossing the first direction DR1.

In an embodiment, the inorganic insulating layer IIL may overlap one end of the organic insulating layer OIL and cover one end of the organic insulating layer OIL.

The additional insulating layer AIL may be disposed on the inorganic insulating layer IIL. The additional insulating layer AIL may partially overlap the inorganic insulating layer IIL. In detail, the additional insulating layer AIL may expose an end part of the inorganic insulating layer IIL overlapping the second organic insulating layer OIL2. The additional insulating layer AIL may include an organic material.

In an embodiment, the inorganic insulating layer IIL may cover one end of the organic insulating layer OIL. That is, a part of the inorganic insulating layer IIL overlapping the organic insulating layer OIL may be disposed on the upper surface of the second organic insulating layer OIL2.

Figure 6:
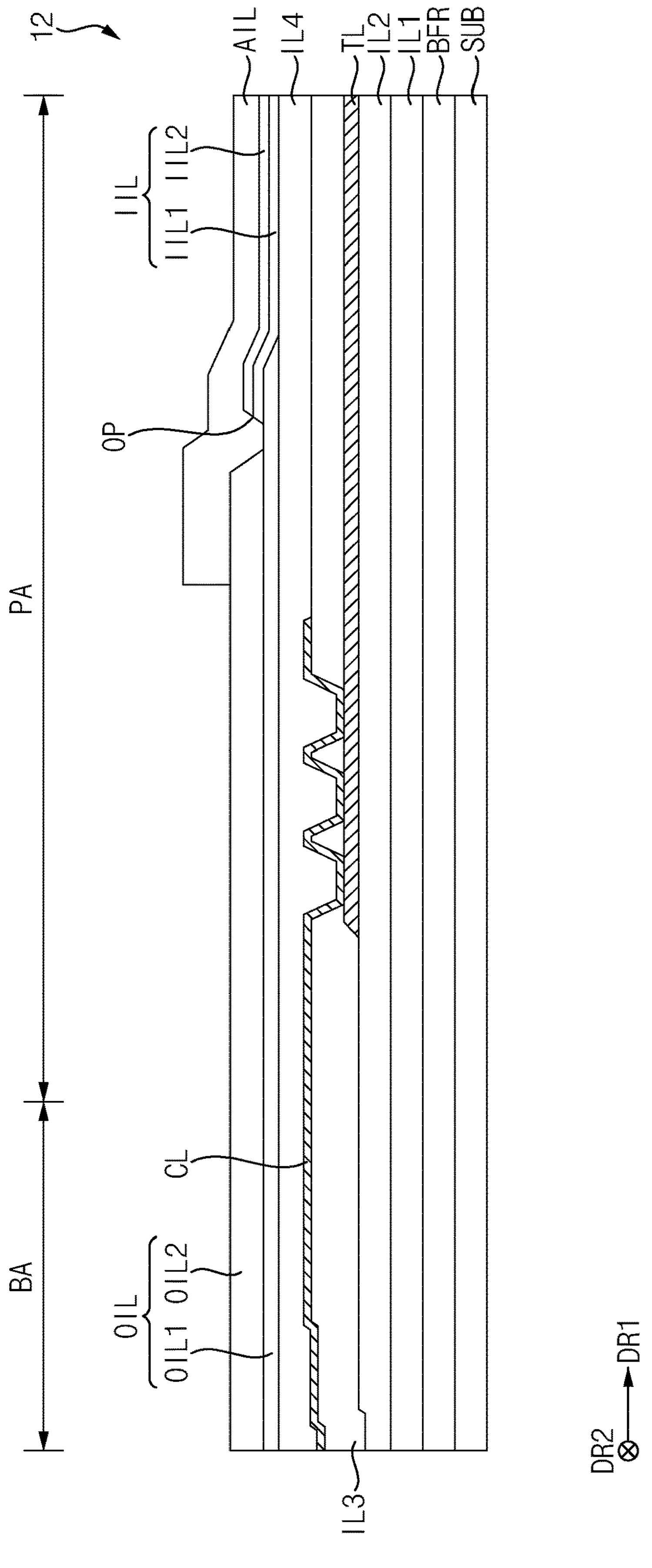
FIG. 6 is a cross-sectional view illustrating another example of FIG. 4.

The additional insulating layer AIL may partially overlap the organic insulating layer OIL. That is, the additional insulating layer AIL may partially overlap the first organic insulating layer OIL1 and partially overlap the second organic insulating layer OIL2. FIG. 6 is a cross-sectional view illustrating another example of FIG. 4.

For example, the display device 12 described with reference to FIG. 6 may be the same as the display device 10 described with reference to FIG. 4 except for the shape of the inorganic insulating layer IIL. Accordingly, redundant descriptions may be omitted or simplified.

Referring to FIGS. 3 and 6, an inorganic insulating layer IIL may be disposed on the organic insulating layer OIL. The inorganic insulating layer IIL may define an opening OP exposing the organic insulating layer OIL. The opening OP may entirely expose the organic insulating layer OIL disposed in the bending area BA. In addition, the opening OP may extend in the second direction DR2 crossing the first direction DR1.

In an embodiment, the inorganic insulating layer IIL may overlap one end of the organic insulating layer OIL and cover one end of the organic insulating layer OIL.

The additional insulating layer AIL may be disposed on the inorganic insulating layer IIL. The additional insulating layer AIL may entirely overlap the inorganic insulating layer IIL. The additional insulating layer AIL may include an organic material.

In an embodiment, a length of the first organic insulating layer OIL1 in the first direction DR1 may be greater than a length of the second organic insulating layer OIL2 in the first direction DR1. That is, the second organic insulating layer OIL2 may expose one end of the first organic insulating layer OIL1.

In an embodiment, each of the inorganic insulating layer IIL and the additional insulating layer AIL may cover one end of the organic insulating layer OIL. Specifically, the inorganic insulating layer IIL may cover one end of the first organic insulating layer OIL1. That is, a part of the inorganic insulating layer IIL overlapping the first organic insulating layer OIL1 may be disposed on the upper surface of the first organic insulating layer OIL1.

Figure 7:
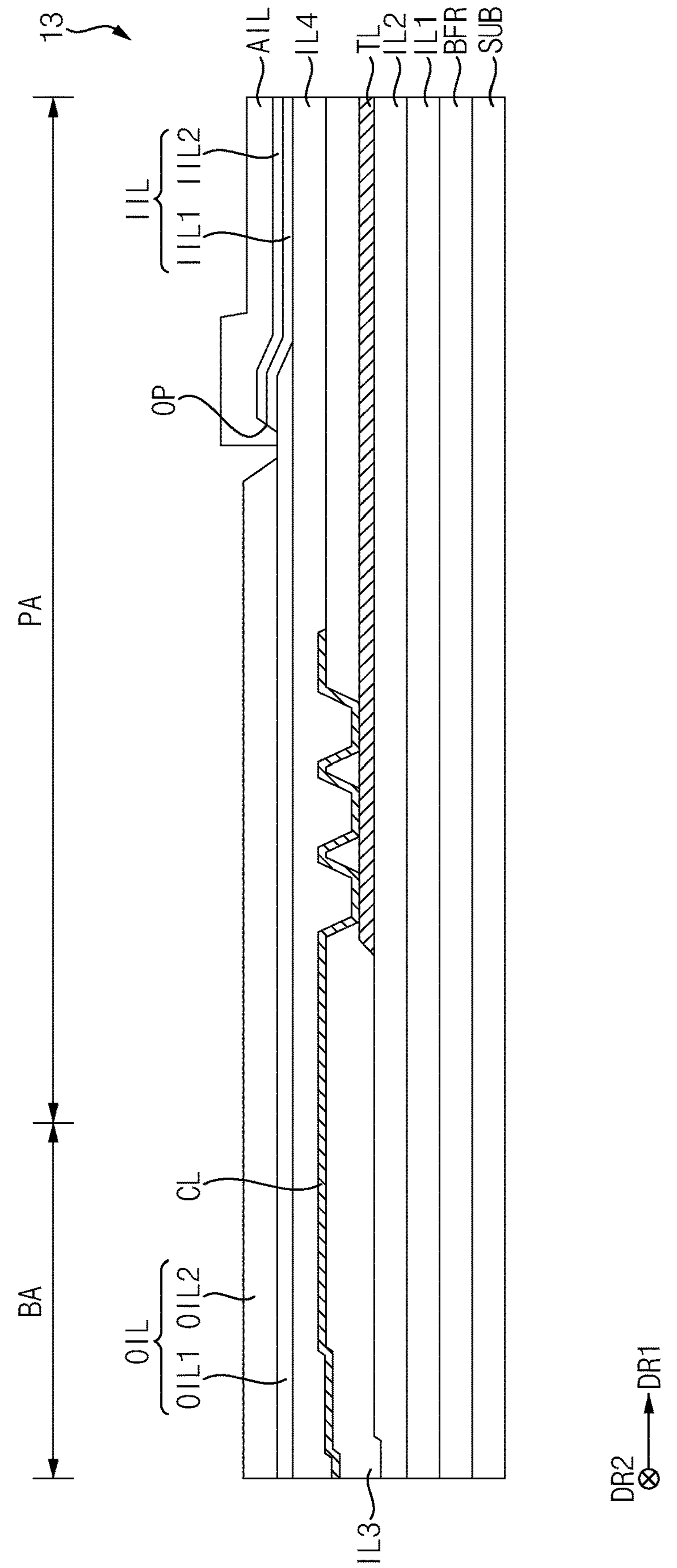
FIG. 7 is a cross-sectional view illustrating another example of FIG. 6.

That is, the inorganic insulating layer IIL may be spaced apart from the second organic insulating layer OIL2 in a plan view. The additional insulating layer AIL may cover the first organic insulating layer OIL1 and one end of the second organic insulating layer OIL2. That is, a part of the additional insulating layer AIL overlapping the organic insulating layer OIL may be disposed on the upper surface of the second organic insulating layer OIL2. FIG. 7 is a cross-sectional view illustrating another example of FIG. 6.

For example, the display device 13 described with reference to FIG. 7 may be the same as the display device 12 described with reference to FIG. 6 except for the shape of the additional insulating layer AIL. Accordingly, redundant descriptions may be omitted or simplified.

Referring to FIGS. 3 and 7, the inorganic insulating layer IIL may be disposed on the organic insulating layer OIL. The inorganic insulating layer IIL may include an opening OP exposing the organic insulating layer OIL. The opening OP may entirely expose the organic insulating layer OIL disposed in the bending area BA. In addition, the opening OP may extend in the second direction DR2 crossing the first direction DR1.

In an embodiment, the inorganic insulating layer IIL may overlap one end of the organic insulating layer OIL and cover one end of the organic insulating layer OIL.

The additional insulating layer AIL may be disposed on the inorganic insulating layer IIL. The additional insulating layer AIL may entirely overlap the inorganic insulating layer IIL. The additional insulating layer AIL may include an organic material.

In an embodiment, a length of the first organic insulating layer OIL1 in the first direction DR1 may be greater than a length of the second organic insulating layer OIL2 in the first direction DR1. That is, the second organic insulating layer OIL2 may expose one end of the first organic insulating layer OIL1.

In an embodiment, each of the inorganic insulating layer IIL and the additional insulating layer AIL may cover one end of the first organic insulating layer OIL1. That is, a part overlapping the first organic insulating layer OIL1 in each of the inorganic insulating layer IIL and the additional insulating layer AIL may be disposed on the upper surface of the first organic insulating layer OIL1. That is, the inorganic insulating layer IIL and the additional insulating layer AIL may be spaced apart from each other with the second organic insulating layer OIL2 in the plan view.

Figure 8:
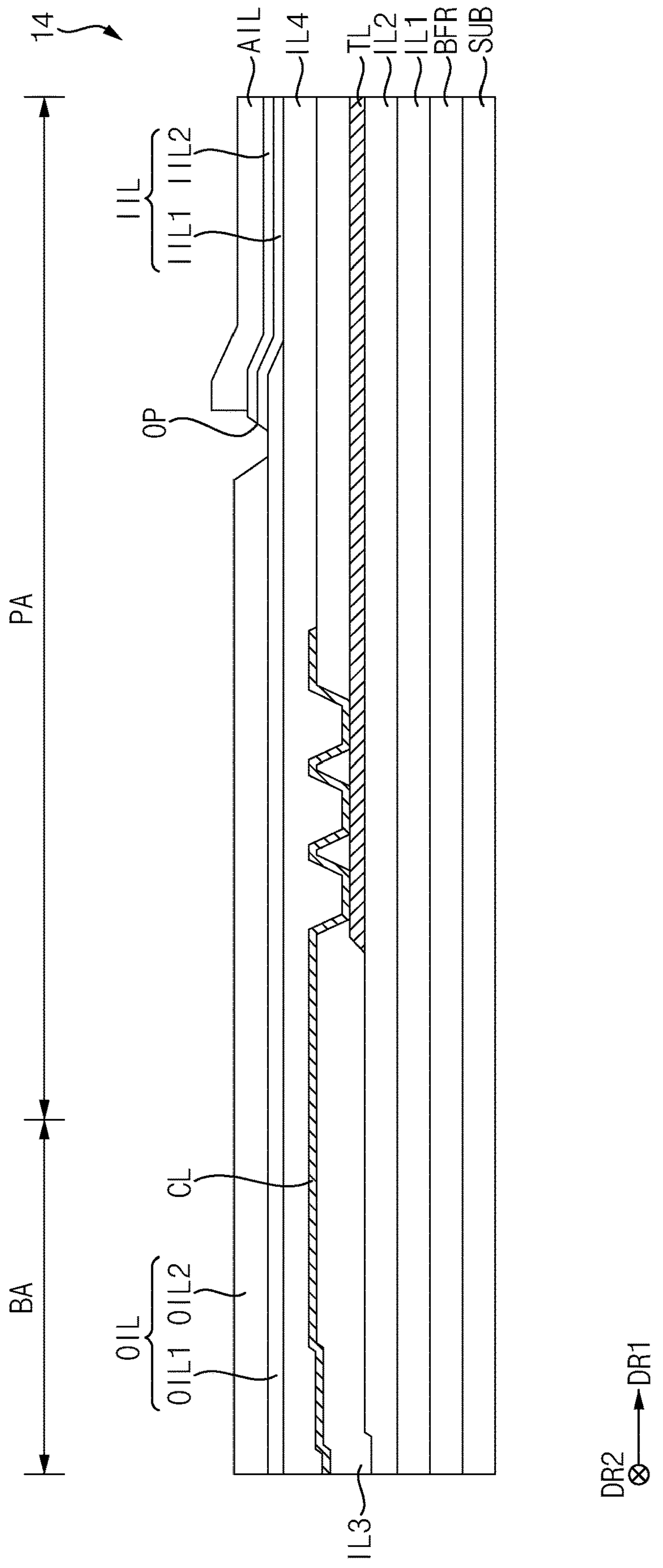
FIG. 8 is a cross-sectional view illustrating another example of FIG. 6.

FIG. 8 is a cross-sectional view illustrating another example of FIG. 6.

For example, the display device 14 described with reference to FIG. 8 may be the same as the display device 12 described with reference to FIG. 6 except for the shape of the additional insulating layer AIL. Accordingly, redundant descriptions may be omitted or simplified.

Referring to FIGS. 3 and 8, the inorganic insulating layer IIL may be disposed on the organic insulating layer OIL. The inorganic insulating layer IIL may include an opening OP exposing the organic insulating layer OIL. The opening OP may entirely expose the organic insulating layer OIL in the bending area BA. In addition, the opening OP may extend in the second direction DR2 crossing the first direction DR1.

In an embodiment, the inorganic insulating layer IIL may overlap one end of the organic insulating layer OIL and cover one end of the organic insulating layer OIL.

The additional insulating layer AIL may be disposed on the inorganic insulating layer IIL. The additional insulating layer AIL may partially overlap the inorganic insulating layer IIL. In detail, the additional insulating layer AIL may expose an end part of the inorganic insulating layer IIL overlapping the first organic insulating layer OIL1. The additional insulating layer AIL may include an organic material.

In an embodiment, a length of the first organic insulating layer OIL1 in the first direction DR1 may be greater than a length of the second organic insulating layer OIL2 in the first direction DR1. That is, the second organic insulating layer OIL2 may expose one end of the first organic insulating layer OIL1.

In an embodiment, the inorganic insulating layer IIL may cover one end of the first organic insulating layer OIL1. That is, a part of the inorganic insulating layer IIL overlapping the first organic insulating layer OIL1 may be disposed on the upper surface of the first organic insulating layer OIL1. That is, the inorganic insulating layer IIL may be spaced apart from the second organic insulating layer OIL2 in the plan view.

The additional insulating layer AIL may partially overlap the organic insulating layer OIL. Specifically, the additional insulating layer AIL may partially overlap the first organic insulating layer OIL1 and may be spaced apart from the second organic insulating layer OIL2 in the plan view. That is, the additional insulating layer AIL may not overlap the second organic insulating layer OIL2.

Figure 9:
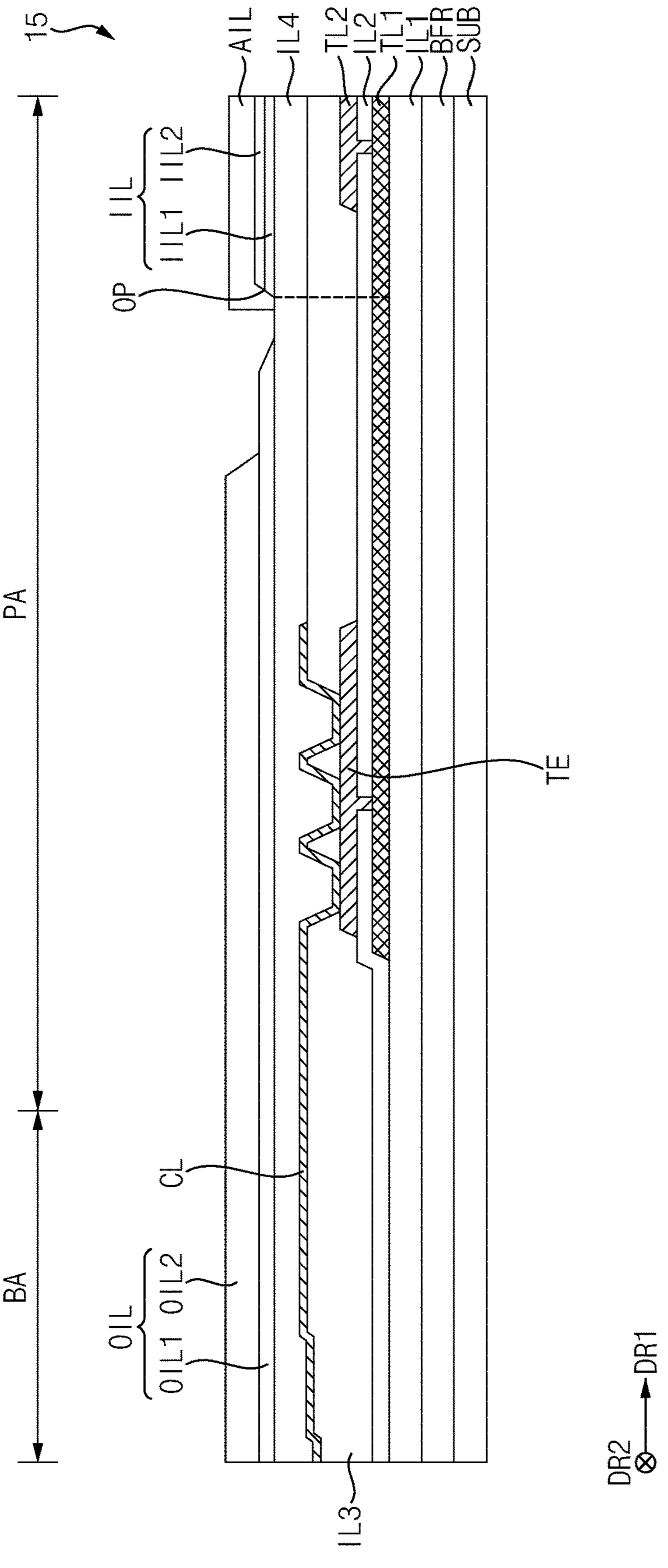
FIG. 9 is a cross-sectional view illustrating a display device according to another embodiment of the present disclosure.

FIG. 9 is a cross-sectional view illustrating a display device according to another embodiment of the present disclosure.

In a display device 15 described with reference to FIG. 9, descriptions overlapping those of the display device 10 described with reference to FIGS. 1, 2, 3, and 4 may be omitted or simplified.

Referring to FIGS. 1, 2, 3, and 9, a substrate SUB may include a display area DA, a pad area PA, and a bending area BA. The pad area PA may be spaced apart from the display area DA in the first direction DR1, and the bending area BA may be disposed between the display area DA and the pad area PA.

A buffer layer BFR and a first insulating layer IL1 may be sequentially disposed on the substrate SUB.

A first transfer line TL1 may be disposed on the first insulating layer IL1. A second insulating layer IL2 may cover the first transfer line TL1 and may be disposed on the first insulating layer IL1. A transfer electrode TE and a second transfer line TL2 may be disposed on the second insulating layer IL2. A third insulating layer IL3 may cover the transfer electrode TE and the second transfer line TL2 and may be disposed on the second insulating layer IL2. A connection line CL may be disposed on the third insulating layer IL3. A fourth insulating layer IL4 may cover the connection line CL and may be disposed on the third insulating layer IL3.

The first transfer line TL1 may include the same material as the gate layer overlapping the display area DA. That is, the first transfer line TL1 may be formed simultaneously with the gate layer. The transfer electrode TE and the second transfer line TL2 may include the same material as the first conductive layer overlapping the display area DA. That is, the second transfer line TL2 may be formed simultaneously with the first conductive layer. The connection line CL may include the same material as the second conductive layer overlapping the display area DA. That is, the connection line CL may be formed simultaneously with the second conductive layer.

The first transfer line TL1 may overlap the pad area PA and may extend from the pad area PA in the direction opposite to the first direction DR1. The connection line CL may be disposed on the first transfer line TL1, the transfer electrode TE, and the second transfer line TL2, and may crossing the bending area BA.

The transfer electrode TE may be disposed on the first transfer line TL1 and may be disposed under the connection line CL. That is, the transfer electrode TE may be disposed between the first transfer line TL1 and the connection line CL. The transfer electrode TE may connect the first transfer line TL1 and the connection line CL.

The second transfer line TL2 may be disposed in the same layer as the transfer electrode TE. The second transfer line TL2 may overlap the pad area PA. In addition, the second transfer line TL2 may be spaced apart from the transfer electrode TE and the connection line CL. The second transfer line TL2 may be connected to the first transfer line TL1. Accordingly, the connection line CL, the transfer electrode TE, the first transfer line TL1 and the second transfer line TL2 may be electrically connected. An organic insulating layer OIL may be disposed on the connection line CL.

Specifically, the organic insulating layer OIL may be disposed on the fourth insulating layer IL4. The organic insulating layer OIL may entirely cover the connection line CL. In addition, the organic insulating layer OIL may cover the connection line CL and one end of the transfer line TL1. One end of the transfer line TL1 overlapping the organic insulating layer OIL may be disposed adjacent to the bending area BA.

The organic insulating layer OIL may include a first organic insulating layer OIL1 and a second organic insulating layer OIL2. The first organic insulating layer OIL1 may be disposed on the fourth insulating layer IL4. The second organic insulating layer OIL2 may be disposed on the first organic insulating layer OIL1 and may be entirely overlapped with the first organic insulating layer OIL1.

In an embodiment, an inorganic insulating layer IIL may be disposed on the fourth insulating layer IL4. The inorganic insulating layer IIL may overlap the pad area PA. In addition, the inorganic insulating layer IIL may include an opening OP exposing the organic insulating layer OIL. The opening OP may entirely expose the organic insulating layer OIL disposed in the bending area BA. In addition, the opening OP may extend in the second direction DR2 crossing the first direction DR1.

In an embodiment, a width of the opening OP in the first direction DR1 may be greater than a width of the organic insulating layer OIL in the first direction DR1. Accordingly, the inorganic insulating layer IIL does not overlap with the organic insulating layer OIL and may be spaced apart from each other in the plan view.

The inorganic insulating layer IIL may include a first sub-layer IIL1 and a second sub-layer IIL2. The second sub-layer IIL2 may be disposed on the first sub-layer IIL1. The first sub-layer IIL1 and the second sub-layer IIL2 may include the same material as each other. For example, each of the first sub-layer IIL1 and the second sub-layer IIL2 may include silicon nitride. However, the present disclosure is not limited thereto.

An additional insulating layer AIL may be disposed on the inorganic insulating layer IIL. The additional insulating layer AIL may entirely cover the inorganic insulating layer IIL. The additional insulating layer AIL may include an organic material. However, the present disclosure is not limited thereto.

In an embodiment, an edge of the second transfer line TL2 may not be exposed by the opening OP of the inorganic insulating layer IIL. That is, an edge of the second transfer line TL2 may be recessed from the opening OP of the inorganic insulating layer IIL.

In an embodiment, an edge of the inorganic insulating layer IIL may overlap the first transfer line TL1. That is, one end of the inorganic insulating layer IIL may not overlap one end of the second transfer line TL2 and may overlap the first transfer line TL1. The inorganic insulating layer IIL may be disposed adjacent to the bending area BA than the second transfer line TL2. That is, the inorganic insulating layer IIL may protrude further into the bending area BA than the second transfer line TL2.

In an embodiment, since the edge of the inorganic insulating layer IIL and the edge of the second transfer line TL2 are not disposed in the vertical line, damage to the second transfer line TL2 can be prevented. Specifically, hydrogen radical and ammonia gas may be generated when forming the inorganic insulating layer IIL.

When the edge of the inorganic insulating layer IIL and the edge of the second transfer line TL2 are disposed on the vertical line, hydrogen radical and ammonia gas may easily reach the second transfer line TL2 in a vertical direction. However, in the present disclosure, since the edge of the inorganic insulating layer IIL and the edge of the transfer line TL are not disposed in a vertical line, the hydrogen radical and the ammonia gas cannot easily reach the second transfer line TL2. Accordingly, oxidation of the second transfer line TL2 can be prevented, and an amount of outgas can be reduced. Accordingly, defect of the display device 15 can be reduced and reliability of the display device 15 can be improved.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a substrate including a display area, a pad area spaced apart from the display area, and a bending area disposed between the display area and the pad area;

a transfer line disposed in the pad area;

a connection line disposed on the transfer line, connected to the transfer line, and crossing the bending area;

an organic insulating layer disposed on the connection line and entirely covering the connection line; and an inorganic insulating layer disposed on the organic insulating layer to overlap one end of the organic insulating layer and including an opening exposing the organic insulating layer.

2. The display device of claim 1, wherein the opening entirely exposes the organic insulating layer in the bending area.

3. The display device of claim 1, wherein the organic insulating layer covers the connection line and one end of the transfer line.

4. The display device of claim 3, wherein the one end of the transfer line overlapping the organic insulating layer is disposed adjacent to the bending area.

5. The display device of claim 1, wherein the inorganic insulating layer includes a first sub-layer and a second sub-layer disposed on the first sub-layer, and wherein each of the first sub-layer and the second sub-layer includes silicon nitride.

6. The display device of claim 5, wherein a film density of the second sub-layer is greater than a film density of the first sub-layer.

7. The display device of claim 1, wherein the organic insulating layer includes:

a first organic insulating layer disposed on the connection line; and a second organic insulating layer disposed on the first organic insulating layer and overlapping the first organic insulating layer.

8. The display device of claim 7, wherein the first organic insulating layer and the second organic insulating layer include a same material.

9. The display device of claim 7, further comprising:

an additional insulating layer disposed on the inorganic insulating layer and including an organic material.

10. The display device of claim 9, wherein a length of the first organic insulating layer is greater than a length of the second organic insulating layer.

11. The display device of claim 9, wherein each of the inorganic insulating layer and the additional insulating layer covers the one end of the organic insulating layer.

12. The display device of claim 9, wherein the inorganic insulating layer covers the one end of the first organic insulating layer and is spaced apart from the second organic in sulating layer, and wherein the additional insulating layer covers the one end of the organic insulating layer.

13. The display device of claim 9, wherein each of the inorganic insulating layer and the additional insulating layer covers one end of the first organic insulating layer and is spaced apart from the second organic insulating layer.

14. The display device of claim 1, further comprising:

an active layer disposed on the substrate and overlapping the display area;

a gate layer disposed on the active layer and partially overlapping the active layer;

a first conductive layer disposed on the gate layer and overlapping the display area; and a second conductive layer disposed on the first conductive layer and overlapping the display area.

15. The display device of claim 14, wherein the first conductive layer includes a same material as the transfer line and is formed at the same time with the transfer line, and the second conductive layer includes a same material as the connection line and is formed at the same time with the connection line.

16. A display device comprising:

a substrate including a display area, a pad area spaced apart from the display area, and a bending area disposed between the display area and the pad area;

a first transfer line disposed in the pad area;

a connection line disposed on the first transfer line and crossing the bending area;

a transfer electrode disposed between the first transfer line and the connection line, and connecting the first transfer line and the connection line;

a second transfer line disposed on the same plane as the transfer electrode, connected to the first transfer line, spaced apart from the transfer electrode and the connection line, and disposed in the pad area; and an inorganic insulating layer disposed on the connection line in the pad area and having an edge non-overlapping with an edge of the second transfer line in a plan view.

17. The display device of claim 16, wherein the edge of the inorganic insulating layer overlaps the first transfer line.

18. The display device of claim 17, wherein the second transfer line overlaps the inorganic insulating layer and the inorganic insulating layer is disposed adjacent to the bending area than the second transfer line.

19. The display device of claim 17, further comprising:

an active layer disposed on the substrate and overlapping the display area;

a gate layer disposed on the active layer and partially overlapping the active layer;

a first conductive layer disposed on the gate layer and overlapping the display area; and a second conductive layer disposed on the first conductive layer and overlapping the display area.

20. The display device of claim 19, wherein the gate layer includes a same material as the first transfer line and is formed at the same time with the first transfer line, wherein the first conductive layer includes a same material as the transfer electrode and the second transfer line, and is formed at the same time with the transfer electrode and the second transfer line, and wherein the second conductive layer includes a same material as the connection line and is formed at the same time with the connection line.

* * * * *